United States Patent [19]
Wong et al.

[11] 3,997,883
[45] Dec. 14, 1976

[54] LSI RANDOM ACCESS MEMORY SYSTEM

[75] Inventors: William Y. Wong, Torrance; Jaw J. Hsieh, Los Angeles, both of Calif.

[73] Assignee: The National Cash Register Company, Dayton, Ohio

[22] Filed: Oct. 8, 1968

[21] Appl. No.: 765,795

[52] U.S. Cl. .................. 340/173 R; 307/238; 307/279

[51] Int. Cl.$^2$ ............... G11C 11/24; G11C 11/34; H03K 3/26

[58] Field of Search ............ 340/173; 307/238, 279

[56] References Cited
UNITED STATES PATENTS

| | | | |
|---|---|---|---|
| 2,771,575 | 11/1956 | Hampton | 340/173 |
| 2,823,369 | 2/1958 | Haug | 340/173 |
| 3,363,115 | 1/1968 | Stephenson | 307/238 |
| 3,373,295 | 3/1968 | Lambert | 307/238 |
| 3,387,286 | 6/1968 | Dennard | 340/173 |
| 3,541,530 | 11/1970 | Spampinato | 340/173 DR |

*Primary Examiner*—Terrell W. Fears

[57] ABSTRACT

A memory cell having three MOS transistors and four external connecting lines, and suitable for fabrication in an array of memory cells forming rows and columns on an LSI chip, is organized into a stack of chips to form a three dimensional random-access read-write memory system. The memory array is organized so that each memory cell on the chip provides capacitive storage for a binary digit of a different word and a single digit is written into or read from a selected memory cell of a single chip or array as a word is written into, or read from, the memory system. The memory cells of each chip are arranged in a matrix of rows and columns, whereby a limited number of semiconductors are required in the memory array to form the capacitive storage memory cells and connecting selection circuitry. The memory cells are designed to operate, and are interconnected in the array, so that all the stored capacitive charges of memory cells common to the row of a selected cell are refreshed as a digit is either written into or read from the selected memory cell.

31 Claims, 9 Drawing Figures

INVENTOR
WILLIAM Y. WONG

SELECTED MEMORY CELL

INVENTOR
WILLIAM Y. WONG

INVENTOR
WILLIAM Y. WONG

LSI RANDOM ACCESS MEMORY SYSTEM

This invention relates to a memory and more particularly to memory arrays comprised of semiconductor memory cells.

With the advent of large scale integration technology, commonly abbreviated LSI, the semiconductor industry has obtained the manufacturing capabilities to fabricate and interconnect a large quantity of circuit components on a single semiconductor chip. In particular, LSI, with its progressive fabrication techniques, has made it economically feasible to produce quantities of interconnected semiconductor memory cells, i.e., binary storage devices, on a chip as required for forming memory arrays for digital computers. The size of a memory array which may be thus fabricated on an LSI chip is limited by the number of electrical connections made to a given size LSI chip and the quantity of semiconductor devices formed on the chip. In accordance with known probability factors affecting LSI fabrication techniques, the production yield of LSI chips is inversely related to the area of the chip, which determines the number of semiconductor devices on the chip, so that an increase in the chip size and consequently the number of semiconductors thereon would tend to decrease its production yield. Accordingly, the size of the LSI chip is limited by a desired production yield. Therefore, with a given size LSI chip, increases in the size of a memory array on the chip can be most practically achieved by decreasing the number of semiconductor devices required to store a binary digit, for example, by using capacitive storage memory cells which require less semiconductor devices than the more conventional flip-flop circuit memory cells. However, the memory array, including a plurality of capacitive storage memory cells, must be designed and organized so that the quantity of semiconductor devices required for the selection of a memory cell in the memory array and for controlling its read/write operation does not offset the savings resulting from capacitively storing a binary digit in a single semiconductor device. Furthermore, although capacitive storage memory cells must be periodically refreshed in order to retain the capacitively stored data, this refreshing also should be obtained with minimum circuitry to realize an advantage from capacitor storage. This could be provided, for example, by increasing the memory cycle time period to include additional time for refreshing in addition to reading or writing in the memory. However, increasing the memory cycle period undesirably decreases the operational speed of the memory by increasing the elapsed time between successive read or write operations performed on the memory. The present invention is advantageous in that it provides for refreshing the capacitively stored data without increasing the memory cycle having the refreshing occur in sychronism with another memory operation. Another feature of this invention is that it provides for designing and interconnecting the memory cells within the memory array so that capacitively stored data is refreshed each time a stored word is written into or read from the memory. In the described memory array, this is achieved by interconnecting the rows and columns of the memory array so that the circuitry provided for writing or reading a binary digit in the memory array additionally provides for refreshing the capacitive memory cells of other stored digits connecting to circuitry common to the digits being stored or read.

In accordance with the features of this invention, which provides a solution to the aforementioned problems, a random access memory system is comprised of a plurality of memory arrays, each array is formed on an LSI chip, and each chip has a plurality of capacitive memory cells formed of metal-oxide-semiconductors, hereinafter also referred to as MOS transistors. The memory array is organized so that each memory cell on the chip provides storage for a binary digit of a different word such that only a single binary digit is written into or read from a single chip or array as a word is written into, or read from, the memory. The memory cells of each chip are organized in a matrix of rows and columns, wherein any one memory cell is selected, for reading or writing a binary digit therein, by its coordinate row and column position in the array. Circuit connections are made to the respective row and column selection lines for each memory cell, it being understood that although a plurality of cells are connected to a common row line or, alternatively, a common column line, only a single selected cell is accessed by a particular row line and a particular column line. However, it is readily seen that the cells in the same row as the selected cell will receive the same signals on the common row lines as the selected cell. The memory cells are designed to operate, and are interconnected in the array so that the row signal, which is provided to help the selection of a particular memory cell, also causes the memory cells in the same row as the selected cell to be refreshed.

Accordingly, one of the objects of this invention is to provide an improved random access memory fabricated of semiconductor memory cells having the foregoing features and advantages.

Other objects and features of the invention will become apparent to those skilled in the art as the disclosure is made in the following detailed description of a preferred embodiment of the present invention as illustrated in the accompanying sheets of drawings, in which:

FIG. 1 is a schematic diagram of an LSI memory cell and connecting circuitry comprised of metal-oxide-semiconductors;

FIG. is a cross section of a typical metal-oxide-semiconductor which can be formed in quantity on an LSI chip;

Figure 1:
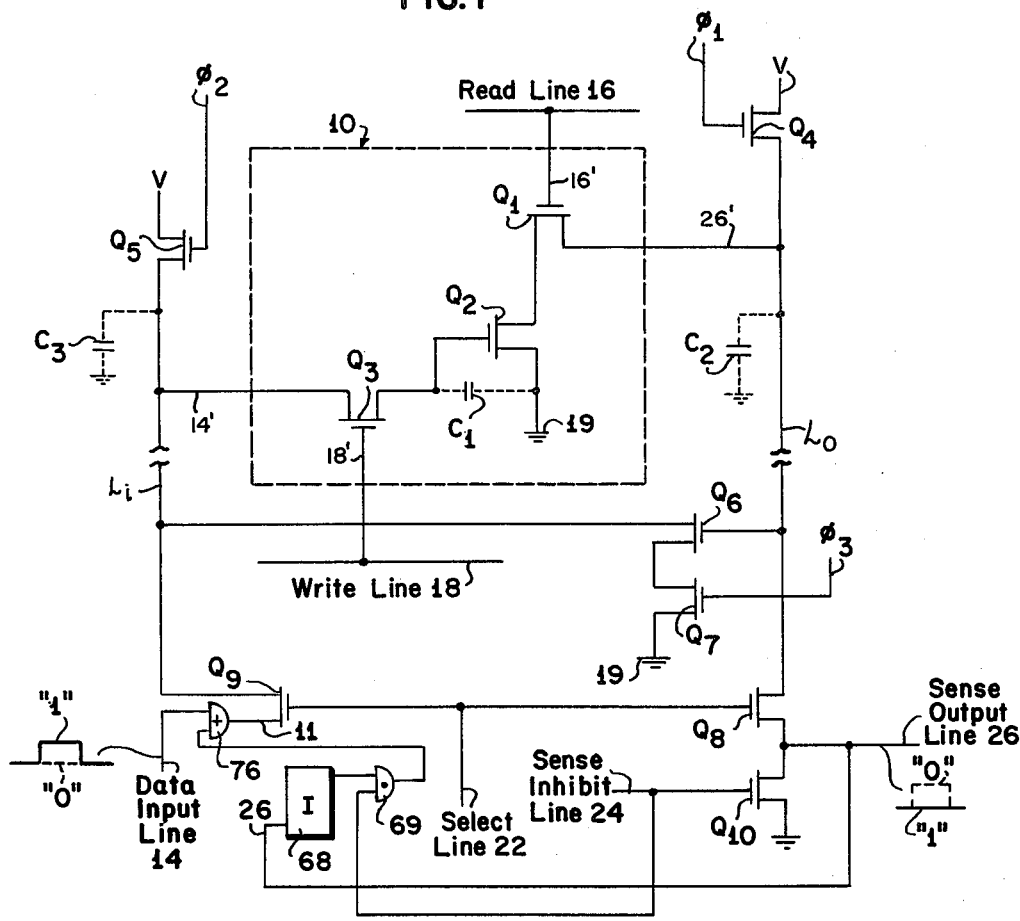

In order to provide a clear understanding of the present invention, a preferred embodiment thereof will be considered from a number of viewpoints and in an order which will best reveal its novel features and advantages. First, the circuitry of a memory cell 10 formed of MOS transistors $Q_1$, $Q_2$ and $Q_3$ interconnected as shown in FIG. 1 will be considered. Next a plurality of memory cells 10 forming a memory array will be described which will point out the advantageous organization of the memory array and design of the memory cell 10. Finally an overall view of a memory, including a plurality of memory arrays, will be presented to point out the parallel operation of the memory.

Figure 2:
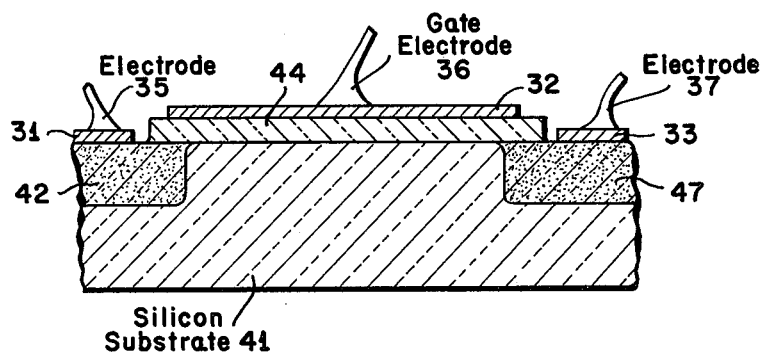

Before proceeding with the description of the memory cell 10 shown in FIG. 1, the characteristics of MOS transistors will be briefly considered here, with reference to the physical structure of an MOS transistor shown in FIG. 2. The MOS transistor is formed on a silicon substrate 41 into which are diffused two spaced and heavily doped regions 42 and 47, commonly referred to as source and drain regions denoting the movement of electrons from one another. These regions will be designated here as "electric terminals." Electrodes 35 and 37 are each connected through electrical contact planes 31 and 33, respectively, to one of the two doped regions 42 and 47. A gate electrode 36 is connected through electrical contact plane 32 to a thin silicon dioxide layer 44 grown over the spaced region of the substrate 41 between the two doped regions 42 and 47. The electrical impedance between regions 42 and 47 is controlled by an electric field across the connecting silicon dioxide layer 44 produced by a voltage on the electrical contact plane 32, so that the conduction between the drain and source electrodes 37 and 35, is a function of a signal voltage on the gate electrode 36, and the transistor is made conductive or non-conductive by the presence or absence, respectively, of a signal on its gate electrode. The silicon dioxide layer 44 is an insulating material giving the gate input of the MOS transistor an extremely high input impedance compared to other transistors such as commonly used junction transistors. The high input impedance of the MOS transistor prolongs the discharge time of the MOS gate capacitance, sown in FIG. 1 as capacitor $C_1$, which typically have a value of 0.2 to 0.6 picofarads. It should be understood that the capacitor symbol C1 shown in FIG. 1 is not a discrete capacitor which is placed in the circuit, but rather is an inherent capacitance residing in the nature of the MOS transistor described in FIG. 2. Thus dotted lines are shown connecting the "phantom" capacitance C1 from the gate electrode Q2 to one of the terminal electrodes of Q2. A read charge capacitor $C_2$ and a refresh charge capacitor $C_3$, shown in FIG. 1, are formed from the distributed capacitance of a conductive line on the LSI chip and may typically have a value of 0.5 to 2 and 1 to 2 picofarads, respectively. The conductive line of FIG. 1 designated as $L_i$ is a metallized line on the chip which has a capacitance $C_3$ shown in FIG. 1 connected with dotted lines to the line $L_i$. This capacitance $C_3$ is also a "phantom" capacitance deriving its existence from the line $L_i$ and is not to be considered as a discrete capacitor which is placed into the circuit. The same situation is true with regard to line $L_0$ shown on the other side of the memory cell 10 wherein there is indicated a dotted line connecting a capacitor C2 to the line $L_0$. $C_2$ represents the distributed capacitance of the line $L_0$ which line $L_0$ is a metallized line in the LSI chip. As seen in FIG. 1 the basic memory cell 10 is composed of three semiconductors Q1, Q2, and Q3 having four external connection lines 14', 16', 18', and 26', and with a "phantom" capacitance C1 inherent to transistor Q2. One terminal electrode of transistor Q2 is shown connected to ground for purposes of this drawing.

The phantom capacitor C1 may be charged with a voltage from line $L_i$ when the switching transistor Q3 is in the "on" or conducting state. For purposes of this discussion, when we speak of a "charge" on capacitor C1 we are talking of a "negative" voltage with respect to ground, with ground being the higher potential.

When a charge is placed across phantom capacitor C1, it is considered that a "1" data bit is stored in the cell. When there is no charge on capacitor C1, it is considered that a zero or "0" data bit is stored in the memory cell.

The memory cell 10 will be seen to have a charge-holding device at Q2 wherein the switching transistor Q3 may become conductive to pass charge in or out from Q2 (or in its nonconducting state to isolate charge on Q2), and wherein switching transistor Q1 and switching transistor Q2 in series provide a path for charge on the line $L_0$ to be discharged (or in the event of nonconduction of Q1 or Q2, the presence of charge on line $L_0$ will be held isolated and incapable of being discharged.

The transistor $Q_1$ is used for helping sense what information resides on the transistor $Q_2$ (and its capacitance C1). If a charge (1) is stored on transistor $Q_2$ across $C_1$, then the transistor $Q_2$ will be in a conducting or low impedance state. If at this moment the transistor Q1 should become conductive, then any charge residing on the line $L_0$ will be passed to ground and discharged so that the line $L_0$ will reflect an opposite charge condition to that residing across the semiconductor $Q_2$. If "no charge" (0) is stored across the transistor $Q_2$ and $C_1$, then the transistor $Q_2$ will be in a non-conducting or "off" state such that even if $Q_1$ should become conducting, there still would be no path for any charge on line $L_0$ to pass on to ground and be discharged.

It will be seen that the transistor Q3 provides a switching function so that if any charge is stored on the line $L_i$, then when the transistor Q3 becomes conducting the charge may pass on line 14' over to the transistor $Q_2$ and capacitor $C_1$. Likewise, should the transistor $Q_2$ and capacitor $C_1$ be charged, and the line $L_i$ be uncharged when the transistor Q3 becomes conductive, then of course the charge on $C_1$ will become discharged through the conductive path 14' to line $L_i$.

Further with respect to FIG. 1, there will be seen that the line $L_i$ is connected to a transistor $Q_5$, which transistor when turned "on" by a signal on its gate, will cause the placement of a voltage V which places charge onto line $L_i$ and hence the phantom capacitor $C_3$. Likewise it will be seen that the line $L_0$ is connected through a transistor $Q_4$ to a source of voltage charge V such that when the gate of $Q_4$ is activated, the transistor Q4 will become conductive and be turned "on" so that the voltage V is connected to the line $L_0$ (to place charge thereon) and of course the phantom capacitor $C_2$.

Figure 3:
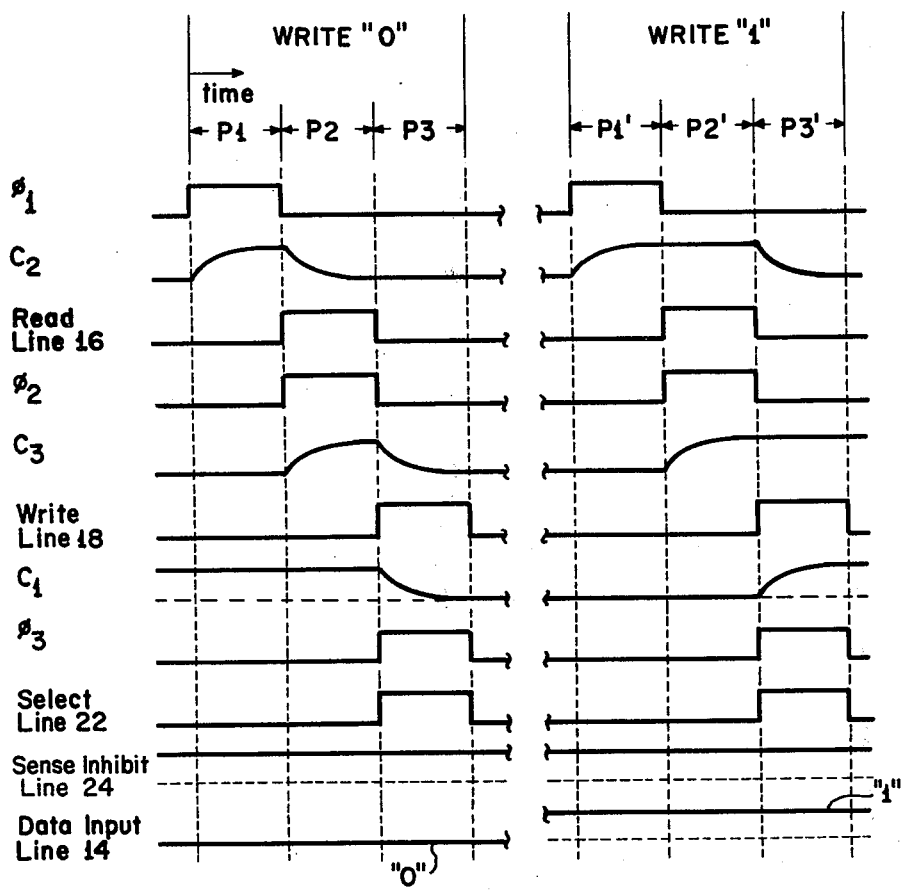
FIG. 3 is a graph illustrating the sequence of signals which writes a digit in the memory cell of FIG. 1.
Figure 3A:
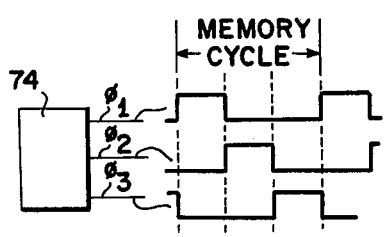
FIG. 3a illustrates memory cycle timing pulses from a clock signal source, which are used by the circuitry of FIGS. 1 and 6.

As seen in FIG. 3a, a pulse generator 74 is provided to generate a memory cycle composed of pulses which occur on separate lines in sequence and which are designated as phase 1, ($\phi_1$), phase 2, ($\phi_2$), phase 3, ($\phi_3$); thus it will be seen that, because of the memory cycle, the transistor Q4 will be turned on by the phase 1 pulse, and the Q5 transistor will be turned on by the phase 2 pulse as shown in the drawing of FIG. 1. Further, as may be seen from FIG. 3 and other timing drawings, the read line 16 is pulsed or charged coincidentally with the phase 2 pulse of the memory cycle and the write line 18 is charge-pulsed coincidentally with the phase 3 memory pulse. So we may observe the sequence: wherein during phase 1, the transistor $Q_4$ is turned on to place a voltage charge on line $L_0$; wherein on phase 2 the transistor Q5 is turned on to permit a voltage charge to be placed on line $L_i$ while at the same time the read line 16 is pulsing the transistor Q1 into the conducting state so that Q1 is switched on and becomes conductive; and wherein the phase 3 memory pulse turns "on" the transistor Q7 and makes it conductive at the same period of time that the write line 18 pulse makes the transistor $Q_3$ conductive.

It should be noted that the transistor Q6, which helps provide a ground or discharge path for line $L_i$, has its switching control (on or off state) controlled by the condition of line $L_0$—which is to say the condition of charge or no charge residing on line $L_0$. If the line $L_0$, and of course capacitor C2, are in a charged state, then the transistor Q6 will be switched "on" to provide a path from line $L_i$ to the transistor switch Q7 to ground at such time as the memory pulse phase 3 turns on the transistor Q7. If the line $L_0$ has a condition of no-charge, then transistor Q6 is turned "off" and cannot conduct so that the condition of line $L_i$ is isolated from any discharge to ground through transistor Q7 at the phase 3 pulse period.

Referring again to FIG. 1, it will further be seen that line $L_0$ may be permitted to conduct through transistor Q8 and through transistor Q10 to ground should both Q8 and Q10 be in the "switched on" or conductive condition. However, if Q8 is conductive and Q10 is not conductive, it will be seen that the resident charge or no-charge on line $L_0$ will be transferred to the sense output line 26.

With respect to the line $L_i$, it will be seen that this line is connected to transistor $Q_9$, which when Q9 is switched "on", will permit any charge to flow or not flow between data input line 14 and the line $L_i$, depending on the relative voltage conditions of the two lines. As will be later seen (from the timing drawings FIG. 3 et seq.) the transistor Q8 and Q9 are turned on only during the phase 3 memory pulse period when the select line 22 is also presenting a voltage pulse. The transistor Q10 which helps to ground or discharge the line $L_0$ at certain times, is controlled by the sense inhibit line 24. This sense inhibit line 24 is, during a "write" operation, in charged condition causing Q10 to be "on", thus grounding the sense output line 26 and preventing any readout to occur since, after all it is desired that data be written into the memory and not read out during this phase. However, on a "read" operation, as will later be seen, the sense inhibit line at phase 3 will be "uncharged" causing Q10 to be "off" or not-conductive so that sense output line 26 can be reflective of any charge or no-charge that might exist on line $L_0$.

The memory cell 10 works in cooperation with the three phase memory cycle, the lines $L_i$ and $L_0$, the switching transistors associated with lines $L_i$ and $L_0$, and other control lines regulating input data, output data, and switching functions.

Basically what is trying to be done here is to store a unit of information whether a charge 1 or a no-charge 0; then to be able to readout this information as desired, and to be able to write in new information as desired without losing any charges placed in the other storage cells, in addition to keeping any charges in the storage cells properly refreshed to maintain accuracy. In the particular embodiment described herein, the configuration is such that on the data input side a 1 is represented by a pulse or charge while a 0 is represented by a no-pulse or no-charge. On the output side (line 26) of this circuit, the information comes out in inverted form so that a 1 bit of information is represented by a no-charge or ground potential and the 0 data bit is represented by a voltage pulse or charge situation.

While a later group of paragraphs will indicate and trace the detailed conditions of each element of the memory cells, as will be seen in FIGS. 3, 4, 5, and 7, it would be instructive to observe the circuitry of FIG. 1 with respect to its operation in the three phases of the memory cycle.

Let us assume a situation in FIG. 1 wherein there is a charge on capacitor C1 across transistor Q2, thus representing a data bit of 1; and it is desired to read out this stored data bit onto the sense line 26. Then, with the advent of a pulse-charge during phase 1, the transistor Q4 will become conductive and place a charge V on line $L_0$ and $C_2$. Now when clock pulse-charge of phase 2 occurs, coincident with the pulse on read line 16 and 16', then the charge on line $L_0$ will be discharged to ground through transistors Q1 and Q2, since Q1 has been turned "on" by read line pulse 16 and transistor Q2 is "on" due to the charge placed across C1. Thus, line $L_0$ is discharged. However, at the same time that this is occurring, the transistor $Q_5$ is "on" and conducting, so that a voltage V can charge up the line $L_i$ and capacitor $C_3$. Thus, during phase 2, the line $L_0$ has been discharged while the line $L_i$ has been charged up. With the advent of pulse-charge at phase 3, it will be seen that transistor Q7 is turned "on", the write line 18 has a pulse-charge turning "on" the transistor Q3, while the sense inhibit line 24 is strobed to ground so that Q10 remains non-conducting and a charge-pulse on select line 22 will render transistors Q8 and Q9 in the conducting or "on" state. Thus during phase 3, we see that: Q6 is turned off since the line $L_0$ had been discharged to ground; that transistor Q7 has been turned "on" by the phase 3 pulse; that the pulse on write line 18 has turned transistor Q3 "on" so that the charge residing on line $L_i$ is conveyed over to transistor Q2 so as to refresh the charge across capacitor $C_1$; the no-charge residing on line $L_0$ is permitted to pass through transistor Q8 (which is turned "on" by select line 22) so that the no-charge of line $L_0$ is reflected onto sense output line 26 which output line is so oriented that a no-charge on output line 26 represents a 1 which means that the data bit 1 which was stored in the memory cell 10 has now been read out on sense output line 26; that the no-charge on sense output line 26 will be inverted by inverter 68 and conveyed through the "on" transistor Q9 as a pulse-charge to line $L_i$ so that the condition of line $L_i$ will not have changed its charge condition in any way. Further details of the feedback line from the sense output 26 to the input line $L_i$ will be discussed hereinafter.

Having just discussed the situation with regard to the reading out of a 1 or charge data bit stored across Q2, we will now turn to the situation where a "no-charge" or 0 data bit is stored across the transistor Q2, and wherein it is desired that a readout be made of the data stored across $Q_2$.

To this end let us now assume that there is a no-charge 0 across transistor Q2 and therefore no-charge across capacitor $C_1$. With the advent of phase 1 pulse, Q4 will become conductive and place a voltage V on the line $L_0$ and its distributed capacitance $C_2$. With the advent of the phase 2, the read line 16 pulse-charge will render $Q_1$ conductive—but since there is no charge on C1 the transistor Q2 is non-conductive so that the charge on line $L_0$ cannot be discharged to ground 19. Concurrently, with the phase 2 pulse, it is seen that Q5 becomes conductive and a voltage V is placed on the line $L_i$ and its distributed capacitance $C_3$. With the advent of phase 3, the following actions take place: (a) The transistor Q6 becomes conductive (since the line $L_0$ is charged and is connected to the gate of Q6); (b) transistor Q7 is turned "on" by the phase 3 pulse so that a connection is made from line $L_i$ to ground, which will discharge the prior charge which resided on line $L_i$. (c) that the pulse on write line 18 renders Q3 conductive so that the 0 or ground voltage on line $L_i$ is connected to capacitor Cl to insure that the voltage across Cl is zero or no-charge; (d) the select line 22 is pulsed to render conductive the transistors Q8 and Q9; (e) the sense inhibit line 24 is strobed so that Q10 is non-conductive and the charge 1 on line $L_0$ is conveyed through the "on" transistor Q8 to sense output line 26 to give a charge pulse which represents 0; (f) the feedback line from the sense output line 26 which carries a pulse-charge is inverted by inverter 68 to give a 0 or ground potential which, when connected through the "on" transistor Q9, maintains the 0 or ground level of line $L_i$. Thus, there has been described a sequence of conditions which occur when a no-charge or 0 data bit has been stored in the memory cell across capacitor Cl.

Likewise for a "data input" operation, a similar sequence of affairs may be traced as will be later described with reference to FIG. 3.

It might be indicated that phantom capacitors C1, C2, and C3, might also be referred to according to their basic functions so that capacitors $C_1$ might be described as the "storage" element, capacitor C2 might be described at the "temporary readout" of information contained in capacitor C1, and capacitor C3 might be referred to as the "refresh" or "refreshing element."

Figure 6:
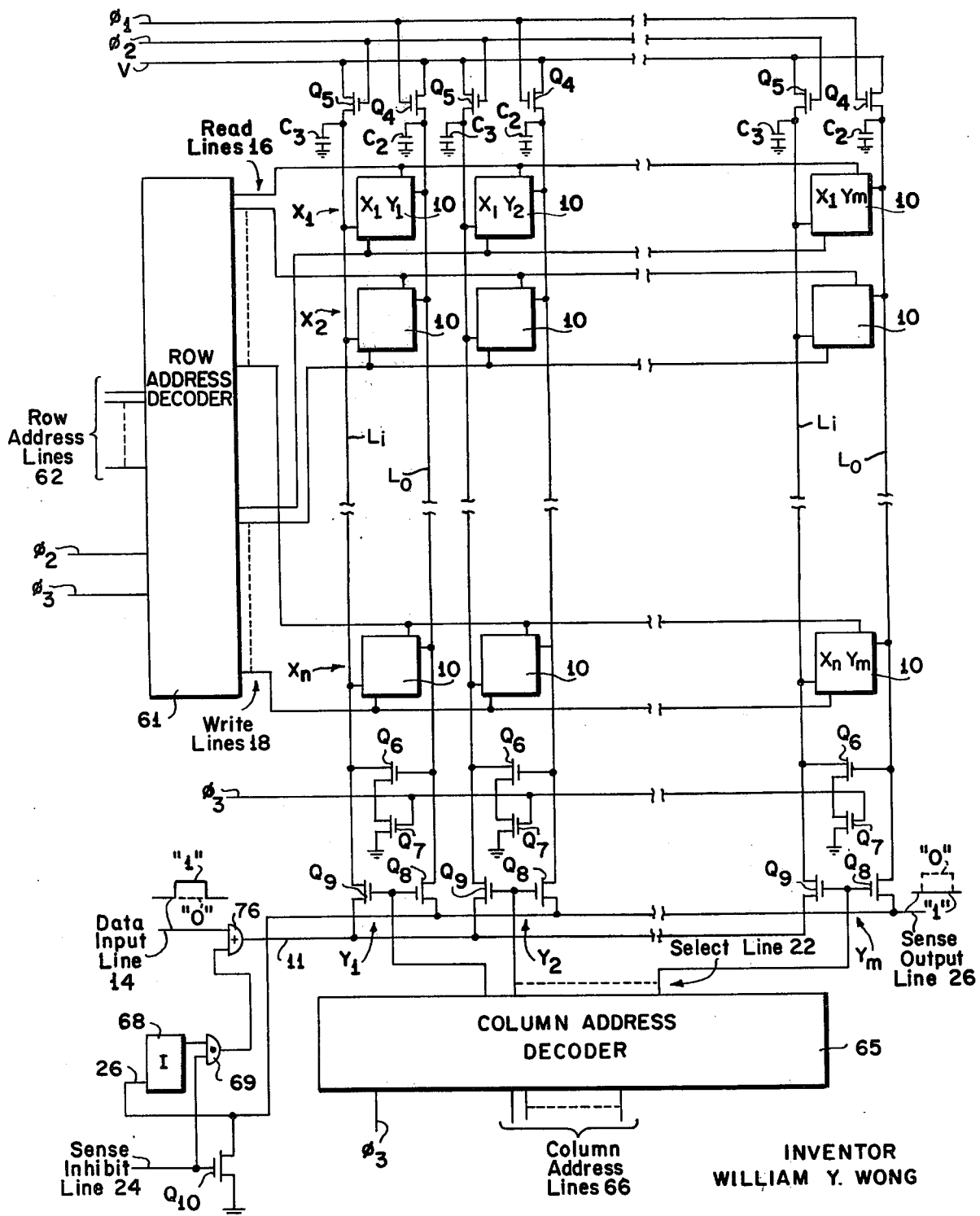
FIG. 6 is a schematic block diagram of a memory array circuit comprised of a plurality of the memory cells of FIG. 1 and formed on an LSI chip.

At this time it would be well to indicate that the basic structure of the diagram of FIG. 1 is configured in multiplicate form as shown in FIG. 6 which will be described in detail hereinafter. However, it is sufficient to note that the memory cell 10 and its four external connections is organized into a matrix or row and columns to form a memory array wherein the two external lines associated with the memory cell, namely $L_i$ and $L_0$ form a column onto which are connected an entire columnar group of memory cells. Further, the read line 16 and the write line 18 common to a memory cell are shown to be duplicated into a series of rows of memory cells each row having its own pairs of read and write lines in common. This makes possible a truly random access memory cell arrangement wherein any given cell in the memory array can be chosen for purposes of writing in or reading out bits of information. The select line 22, previously discussed with respect to FIG. 1, will now be seen to be a specific one of a group of lines wherein a given column of cells 10 is selected for a pulsecharge on phase 3. Likewise, each row of memory cells has its own common pair of read and write lines peculiar to itself which can be selected for operation during a phase 2 and phase 3 period, and which will be peculiar to any chosen row or cells selected by a row address means to be described hereinafter. As discussed later, row address and column address means make it possible to select any memory cell in a two dimensional array; and as will be later discussed, two dimensional arrays can be stacked in a three dimensional configuration which will permit parallel and simultaneous usage of any selected memory cell in a group of two dimensional memory arrays.

It might be pointed out with some significance that the memory system in addition to providing for the input of data and the readout of data, also provides for the simultaneous refreshment of stored data in the memory cells without the need for or addition of a special "refresh" cycle. Inherent in the memory system with the three phase memory cycle, is the provision for the refreshment of any condition of charge or no-charge across the transistor Q2 of the memory cells.

Following the usual activities which occur on the pulses of phase 1 and phase 2, it is seen that at phase 3 there is always a "write" pulse whether or not data is to be put into the cell or read out from the memory cell. The pulse at phase 3 on write line 18 always turns on the transistor $Q_3$ so that the voltage potential condition on line $L_i$ and capacitor $C_3$ will always be connected to transistor Q2 so that, on phase 3, the charge condition across Q2 is matched to the charge condition of line $L_i$. This always insures the refreshment of the desired condition across Q2 as a routine matter whether there is a desired data input action, a desired readout action, or no action at all (that is, the memory just sitting there and not being read out of or written into).

Referring to FIGS. 1 and 3, a binary digit is written into the memory cell 10 during a memory cycle comprised of three sequential pulses from a clock signal source 74, shown in FIG. 3a, on clock lines $\phi_1$, $\phi_2$ and $\phi_3$, each pulse defining a first, second and third period in the memory cycle. A clocked sequence of signals shown during periods designated P1, P2 and P3 are for storing a 0 digit and, alternatively, signals shown during periods designated P1', P2' and P3' are for storing a 1 digit. The operation of the circuits and signals applied thereto during periods P1 and P2 or periods P1' and P2' is the same as periods P7 and P8 shown in FIG. 4, and will be considered in greater detail in the ensuing description. It is sufficient for an understanding of the write operation to note that at the end of period P2, capacitor $C_2$ has been discharged and capacitor $C_3$ charged, and at the end of period P2' capacitors $C_2$ and $C_3$ have both been charged. A binary signal level placed on data input line 14 is gated through OR gate 76 to input line 11 and corresponds to the binary digit to be written into the memory cell 10, for example, a voltage V corresponds to a 1 digit and a ground level signal corresponds to a 0 digit. With respect to the timing diagrams to FIG. 3, FIG. 4, FIG. 5, and FIG. 7, it should be pointed out that these are diagrammatic and not factual potentials. For example, the base line or low line shown in these diagrams represents the zero or ground potential of voltage while the rising line or pulse represents a lower voltage or negative potential. Thus the drawings are consistent in this respect wherein the ground or high potential in terms of absolute voltage is shown as the base (ground) line and the pulse or "charge" is shown as the higher line but which in actuality represents a charge or voltage potential lower than ground in absolute voltage. During periods P3 or P3', a switching pulse on write line 18 permits conduction through a charge control transistor $Q_3$ during the pulse interval, the direction of conduction being determined by the pre-existing charge on capacitor $C_1$ of storage transistor $Q_2$ and the signal level on line $L_;$. For example, as shown during period P3 of FIG. 3, if data storage capacitor $C_1$ had previously been charged to a voltage V corresponding to a stored 1 digit and a signal on data input line 14 was at a ground level corresponding to a 0 digit to be written into the memory cell 10, the voltage on capacitor $C_1$ would be discharged through charge control transistor $Q_3$ to the ground potential of line 14. It should be noted that the voltage on capacitor $C_3$ is also discharged through transistor $Q_9$ to line 11, sense output line 26 is maintained inoperative at a ground level by a signal on sense inhibit line 24 rendering transistor $Q_{10}$ conductive, and the writing of a 0 digit is thus not affected by the state of capacitors $C_2$ and $C_3$ whose purpose will be later described with reference to FIGS. 4 and 5. Conversely, as shown during the period designated P3' if capacitor $C_1$ was not previously charged, as for a stored 0 digit, and the signal on data input line 14 is at voltage level V to write a 1 digit, the capacitor $C_1$ is charged from the voltage on line 14 through conducting transistors $Q_3$ and $Q_9$ (which turns "on" into the conductive state at phase 3 when the select line 22 is pulsed). It is again noted that, as when a 0 digit was written into memory cell 10, the states of capacitors $C_2$ and $C_3$ do not affect the writing of a 1 digit in the memory cell 10. It is thus shown that at the completion of period P3, or period P3', the voltage charge on capacitor $C_1$ will correspond to the signal level on data input line 14 which represents a binary digit to be stored in the memory cell 10.

Figure 4:
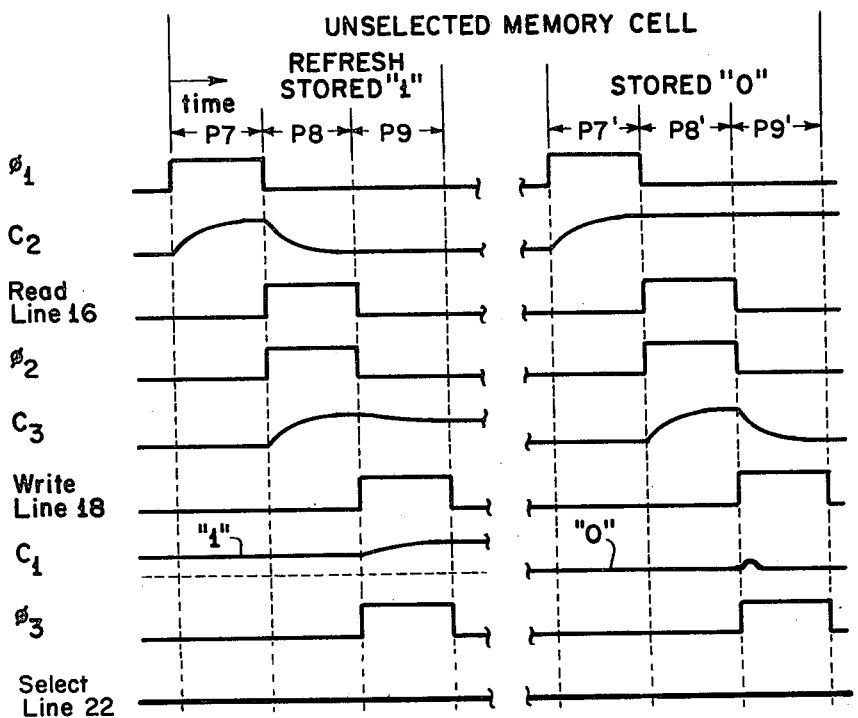
FIG. 4 is a graph illustrating the sequence of signals refreshing a capacitively stored digit in the memory cell of FIG. 1.

Referring to FIGS. 1 and 4, it will next be described how a memory cell 10, which has not been selected to be read out of or written into, and is storing a 1 digit as represented by a charge on capacitor $C_1$, is refreshed by a clocked sequence of signals shown during sequential time periods designated P7, P8 and P9 in FIG. 4. First to be noted is that during period P7 a pulse on clock line $\phi_1$ enables conduction from a voltage line V through transistor $Q_4$ to charge capacitor $C_2$. During the following period P8, a conductive path is provided from read charge capacitor $C_2$ through read control transistor $Q_1$ to transistor $Q_2$ by a pulse applied on read line 16 to the gate input of transistor $Q_1$. Read control transistor $Q_2$ is made conductive by the voltage charge on capacitor $C_1$ and the voltage previously impressed on capacitor $C_2$ will be discharged through transistors $Q_1$ and $Q_2$ to ground point 19. It should be understood that even though there has been a prior partial discharge of capacitor $C_1$ due to the input impedance of transistor $Q_2$, the charge shown on capacitor $C_1$ is sufficient to cause capacitor $C_2$ to be discharged through transistor $Q_2$ to ground point 19. In addition to the described pulse applied on read line 16, a pulse is concurrently with the read pulse applied on clock line $\phi_2$ which connects voltage line V through transistor $Q_5$ to charge capacitor $C_3$. During period P9, a pulse on write line 18 to the gate of transistor $Q_3$ provides a conductive path for transferring the charge from capacitor $C_3$ to capacitor $C_1$, thereby refreshing the stored charge on capacitor $C_1$ as the charges on capacitors $C_1$ and $C_3$ are balanced. A pulse on clock line $\phi_3$, making a transistor $Q_7$ conductive, does not affect the refresh operation of a memory cell 10 when a 1 is stored therein, inasmuch as capacitor $C_2$ is discharged, (and $Q_6$ remains nonconductive) and this signal will be further considered when a memory cell 10 having a stored 0 is described with reference to periods designated P7', P8', and P9' in FIG. 4.

The capacitor $C_1$, of a memory cell 10 (being a non-selected cell, that is not subject to any pulses from select line 22) having a stored 0 digit, is not charged nor will it become charged by a refreshing cycle as indicated by the signals during periods P7', P8' and P9' of FIG. 4. The signal $\phi_1$ shown during period P7' is the same as previously described during period P7 and capacitor $C_2$ is charged by conduction through transistor $Q_4$. During period P8', a pulse on line $\phi_2$ charges capacitor $C_3$ and a concurrent pulse on read line 16 makes transistor $Q_1$ conductive as previously described and shown during period P8. However, in this case, the transistor $Q_2$ is not conductive due to the absence of a charge on capacitor $C_1$. Accordingly, capacitor $C_2$ is not discharged through transistor $Q_1$ and $Q_2$ to ground point 19 as occurred during the previously described period P8. The stored 0 in the memory cell 10 is thereby indicated by a zero voltage charge on capacitor $C_1$. During period P9', with transistor $Q_6$ being conductive, then transistors $Q_3$ and $Q_7$ are made conductive by a pulse on write line 18, the charge on capacitor $C_2$, and a pulse on clock line $\phi_3$, respectively. A conductive path is thus provided to discharge capacitor $C_3$ through trasistors $Q_6$ and $Q_7$ to ground point 19. Any charge that may start to accumulate on capacitor $C_1$ as capacitor $C_3$ discharges, is also discharged during period P9' through the conductive path formed by transistors $Q_3$, $Q_6$ and $Q_7$ to ground point 19, thereby retaining the stored 0 digit in the memory cell 10. It should be noted that although the read and write lines were provided with signals during the refresh operation described, these signals are ineffective for reading into or writing out of the cell inasmuch as the cell has not been supplied with a select signal 22.

Figure 5:
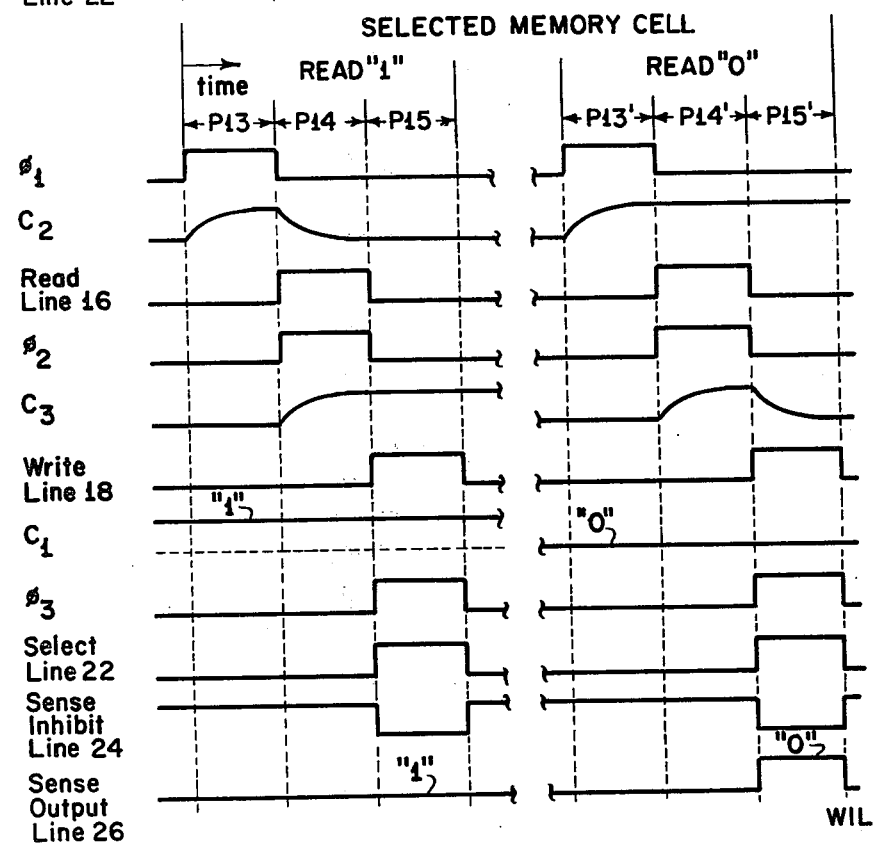
FIG. 5 is a graph illustrating the sequence of signals which reads a stored digit from the memory cell of FIG. 1.

Referring to FIGS. 1 and 5 with regard to a selected memory cell in an array, the memory cell 10, having a 1 digit stored by a charge on capacitor $C_1$, is read by a sequence of signals shown during sequential time periods P13, P14 and P15. The signals shown during periods P13 and P14 in FIG. 5 are the same as those previously described during periods P7 and P8 in FIG. 4, and it is sufficient for an understanding of the read operation to merely note that at the end of period P14 capacitor $C_3$ is charged and capacitor $C_2$ is discharged. During period P15, defined by a signal on clock line $\phi_3$, transistor $Q_8$ is made conductive by a pulse on select line 22 and transistor $Q_{10}$, which is normally conducting, is made non-conductive by a strobe signal on sense inhibit line 24. A signal appearing on sense output line 26 during period P15 is the zero voltage on capacitor $C_2$ which indicates that a 1 digit is stored in memory cell 10. When the output signal is strobed on sense output line 26 during period P15, the inverse of that signal level is gated from an inverter 68 through a AND gate 69 by the same strobe signal from sense inhibit line 24 onto the input line 11, it being noted that the 0 and 1 voltage levels on input line 11 are the same as those previously described for input data line 14 which are the inverse of those on output line 26. With a 1 digit read from memory cell 10 on sense output line 26 during period P15 a 1 voltage level is applied to input line 11 from the AND gate 69 and capacitor $C_3$ is unable to discharge through the path created by the conducting transistor $Q_9$, but rather the voltage from OR gate 76 is connected through transistor $Q_9$ to memory cell 10 and refreshes the charge on capacitor $C_1$ when gated by a pulse on write line 18 to transistor $Q_3$. It should now be understood that when a memory cell is selected to be read, the charge on its capacitor $C_1$ is also refreshed. The memory cell 10, having a stored 0 digit, is read by the sequence of signals shown during three sequential time periods designated P13', P14', and P15'. The signals during periods P13' and P14' are the same as those previously described signals occurring during periods P7' and P8'. In accordance with the prior description, it should be noted that capacitors $C_3$ and $C_2$ are charged at the end of period P14'. During period P15', transistors $Q_8$ and $Q_{10}$ are made conductive and non-conductive, respectively, by the signals shown on lines 22 and 24; and the signal on sense output line 26 during period P15' is the voltage charge on capacitor $C_2$ which indicates that a 0 digit is stored in memory cell 10. A 0 level signal (ground) is applied to line 11 from AND gate 69 causing the capacitor $C_3$ to discharge through transistor $Q_9$ and the phase 3 gating signal on write line 18 to transistor $Q_3$ does not change the charge on capacitor $C_2$.

Figure 7:
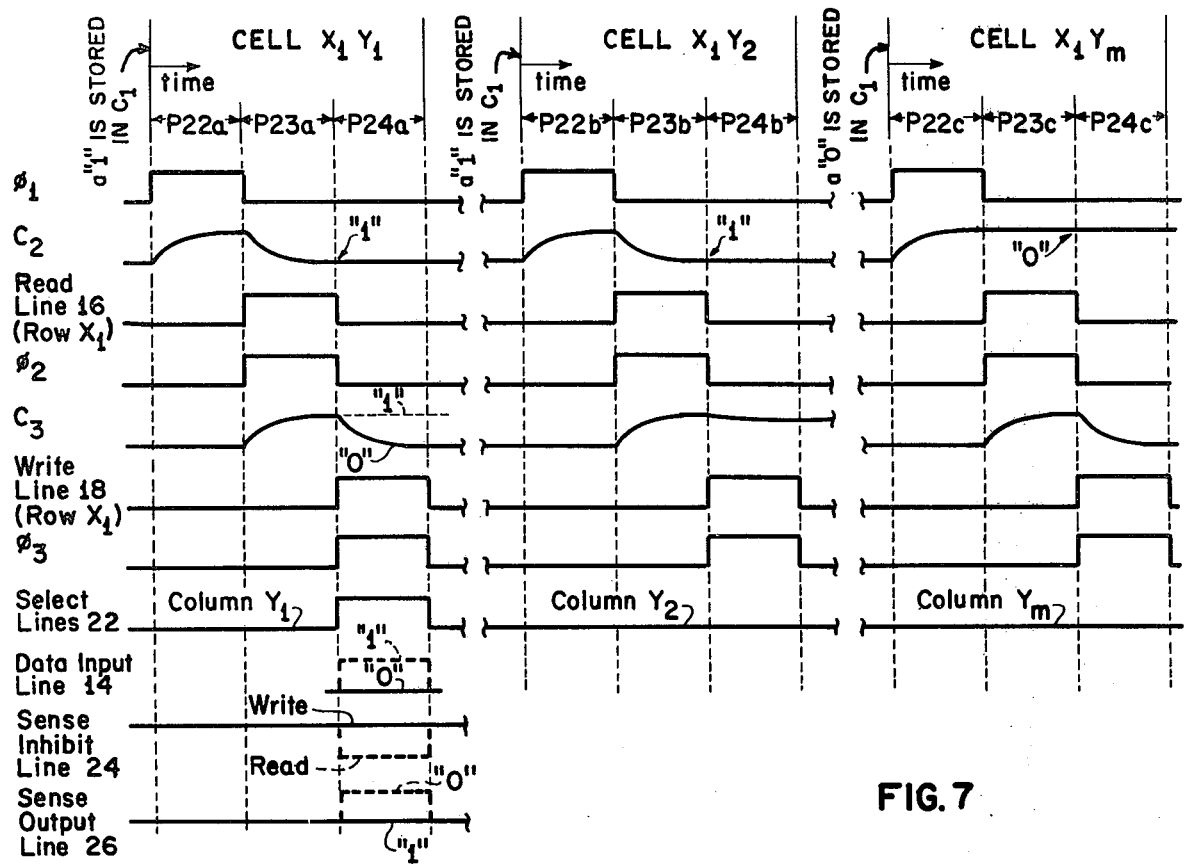
FIG. 7 is a timing diagram which will be used to describe the operation of the memory array of FIG. 6.

Referring now to FIG. 6, there is shown a two-dimensional array of memory cells 10 arranged in rows and columns, it being noted that the memory cells 10 in each column are commonly connected to capacitors $C_2$ and line $L_i$, and $C_3$ and line $L_0$ and a set of control transistors such that line $L_i$ connects to $Q_3$, $Q_5$, $Q_9$, and $Q_9$; while line $L_0$ connects to Q1, Q4, Q8, and the gate of Q6, which were previously described with reference to the single memory cell 10 shown in FIG. 1. Each row of memory cells 10 is connected to a row address decoder 61 with a read line 16 and a write line 18 and each column of memory cells 10 connects to a column address decoder 65 with a select line 22. Address decoders 61 and 65 select a single memory cell 10 in the matrix shown in FIG. 6 with signals on lines 16 and 18 to the rows and lines 22 to the columns. Binary addresses on input lines 62 to the row address decoder 61 and input lines 66 to the column address decoder 65 are converted to signals which select a particular memory cell 10. Signals from the row address decoder 61 are gated by pulses on clock lines $\phi_2$ and $\phi_3$ on lines 16 and 18 and signals from the column address decoder 65 are gated by a pulse on clock line $\phi_3$ on line 22 as indicated in FIG. 7.

Each of lines 22 from the column address decoder 65 connects to a column $Y_1$, $Y_2$ — or $Y_m$ of memory cells 10 and each of read lines 16 and each of write lines 18 from row address decoder 61 connect to rows $X_1$, $X_2$, — or $X_n$ of memory cells 10. Any particular memory cell 10 in the memory array is readily designated and identified by its X-Y coordinate, for example, the memory cell 10 in the upper-left corner of FIG. 6 is cell $X_1Y_1$, and the memory cell 10 in the lower-right corner is cell $X_nY_m$.

It will now be described how a binary digit is written into a memory cell 10 selected by signals on its coordinate X and Y wires by referring to both the memory array of FIG. 6 and the timing diagram of FIG. 7. Furthermore, it will be shown how stored 1 digits, in the same row $X_1$ as a selected cell $X_1Y_1$, are refreshed as a 0 digit is written during a data input write-operation, into the selected cell $X_1Y_1$ during periods P22, P23 and P24, which are defined by pulses on clock lines $\phi_1$, $\phi_2$ and $\phi_3$, respectively. The description will assume that, prior to period P22, 1s are stored in cell $X_1Y_1$ and cell $X_1Y_2$ and a 0 is stored in cell $X_1Y_m$. Letters a, b and c are appended to period designations P22, P23 and P24 to indicate a set of signals specifically relating to cells $X_1Y_1$, $X_1Y_2$ and $X_1Y_m$, respectively, and occurring during these periods. During periods designated P22a, P22b and P22c, a pulse on clock line $\phi_1$ makes the transistor $Q_4$ in each column of the memory array conductive, thereby charging the respective capacitor $C_2$ of each column. It should be noted that the described charging of capacitor $C_2$ is independent of the stored digit in a memory cell 10 and signals during perid P22 are the same for all memory cells 10 in row $X_1$. A pulse on read line 16 to row $X_1$ during period P23 causes the memory cells 10 storing a 1 digit and common to row $X_1$ to discharge capacitor $C_2$, as shown during periods designated P23a and P23b for columns including cells $X_1Y_1$ and $X_2Y_2$, respectively, it being understood that capacitor $C_2$ connected to the column of cell $X_1Y_m$, which has a stored 0, remains charged during period P23c. A pulse on clock line $\phi_2$, concurrent with the pulse on read line 16 to row $X_1$, makes the transistor $Q_5$ in each column $Y_1$, $Y_2$, — $Y_m$ conductive, thereby charging the capacitor $C_3$ of each column as shown during periods P23a, P23b and P23c. During periods P24a, P24b and P24c, a phase 3 gating pulse on write line 18 to memory cells 10 in row $X_1$ and a concurrent phase 3 gating pulse on select line 22 (no select pulse to columns $Y_2$ and $Y_m$) to column $Y_1$ strobe a 0 digit, on data input line 14 to OR gate 76, through transistor $Q_9$ (which is "on" due to pulse on select line 22) of column $Y_1$ and into memory cell $X_1Y_1$ of row $X_1$. As a 0 digit is written into cell $X_1Y_1$, capacitor $C_3$ in column $Y_1$ is discharged through transistor $Q_9$ to the zero voltage level of data input line 14.

The stored charge on capacitor $C_3$ of column $Y_2$, shown in period designated P24b, is gated by the signal on write line 18 of row $X_1$ and the capacitively stored 1 in unselected memory cell $X_1Y_2$ is refreshed as previously described with reference to FIG. 1. In this manner, the write signal on line 18 to row $X_1$ (which was also used to select cell $X_1Y_1$) also provides for refreshing the capacitively stored 1s in the unselected memory cells 10 of row $X_1$. Capacitors $C_3$ of memory cells 10 in row $X_1$ having a stored 0, such as cell $X_1Y_m$, are discharged to ground through transistors $Q_6$ and $Q_7$, which are made conductive by the charge on capacitor $C_2$ (said charge on C2 not being able to discharge through Q2 since Q2 had 0 charge) and the pulse on line $\phi_3$, respectively, as shown in period designated P24c.

Still referring to the memory array of FIG. 6 and the timing diagram of FIG. 7, it will now be described how a binary digit is read, during a "read out" operation, from a selected memory cell $X_1Y_1$ and it will then be described how the stored 1 digits in row $X_1$ are refreshed as the stored digit is read from cell $X_1Y_1$. Periods P22 and P23 were previously described when the write operation was considered, it being recalled that capacitors $C_3$ are charged as shown during periods of phase 2 designated as P23a, P23b and P23c; and capacitors $C_2$ associated with cells $X_1Y_1$ and $X_1Y_2$ were discharged as shown during phase 2 periods P23a and P23b, respectively, since 1 digits are stored in the phantom capacitance C1 of the transistors $Q_2$ of these cells and; conversely, capacitor $C_2$ associated with cell $X_1Y_m$ remained charged as shown during period P23a as a 0 digit is stored in cell $X_1Y_m$.

The digit stored in cell $X_1Y_1$ is read out on sense output line 26 during period P24a by a signal on sense inhibit line 24 making transistor $Q_{10}$ non-conductive and a pulse on select line 22 to column $Y_1$ making transistor $Q_8$ conductive and thereby gating any signal on capacitor $C_2$ to sense output line 26. In this manner the digit stored in cell $X_1Y_1$ is read onto output line 26, it being noted that a zero voltage level (ground) on line 26 indicates a 1 digit is stored in cell $X_1Y_1$ and, conversely, a voltage level resulting from a charge existing on capacitor $C_2$ would have indicated a stored 0 digit.

Even though capacitively stored data may be retained in a memory cell for many thousands of memory cycles without being refreshed, it is readily appreciated that as the size of the memory is increased it becomes more advantageous to be able to refresh a row of memory cells 10 as a stored digit is read from a cell in the row, in a manner similar to that previously described where row $X_1$ was refreshed when a digit was written into cell $X_1Y_1$. However, when a digit was written into cell $X_1Y_1$, it is in effect refreshed, and only the remaining cells in row $X_1$ need be acted upon. On the other hand, when a digit is read from cell $X_1Y_1$, for example, the entire row of cells in row $X_1$ having stored 1 digits, including cell $X_1Y_1$, must be acted upon for the row to be refreshed. The circuit shown in FIG. 6 makes it possible to refresh the selected memory cell 10 from which a stored digit is read by connecting sense output line 26 to an inverter 68, and connecting a signal on sense inhibit line 24 to AND gate 69 to gate the output of inverter 68 to input line 11. Accordingly, when a digit signal level is strobed from the sense output line 26 as shown during period P24a, as previously described, the inverse of that signal level is gated from inverter 68 through AND gate 69 by the signal on sense inhibit line 24 and passes through OR gate 76 onto the input line 11, it being noted that 0 and 1 voltage levels on input line 11 are the same as those on data input line 14 which are the inverse of those on output line 26. With a 1 digit read from cell $X_1Y_1$ on ouput line 26 as shown during period P24a, a 1 voltage level is applied to input line 11 from the gate 69; and capacitor $C_3$ is unable to discharge through the path created by the conducting transistor $Q_9$, during phase 3 but rather the voltage on line 11 is now connected through transistor $Q_9$ to cell $X_1Y_1$ and refreshes cell $X_1Y_1$ when gated by a phase 3 write pulse on line 18 to row $X_1$.

On the other hand, if a 0 had been stored in cell $X_1Y_1$, a 0 level signal would have been applied to line 11 from gate 69 causing the capacitor $C_3$ to discharge through transistor $Q_9$.

Cell $X_1Y_2$ is refreshed as shown in period P24b, as previously described with reference to FIG. 1, by the phase 3 write pulse on line 18 to row $X_1$ gating the charge from capacitor $C_3$ to cell $X_1Y_2$. The remaining cells in row $X_1$ storing a digit 1 are similarly refreshed. With a digit 0 stored in cell $X_1Y_m$, capacitor $C_2$ remains charged at the end of phase 2 period P23c and a pulse on clock line $\phi_3$ during period P24c discharges capacitor $C_3$ of column $Y_m$ through transistors $Q_6$ and $Q_7$ to ground. Although positive signals are shown in FIGS. 3, 4, 5 and 7, it should be understood that the polarity of signals used may be either positive or negative to match the characteristics of the semiconductor devices.

Figure 8:
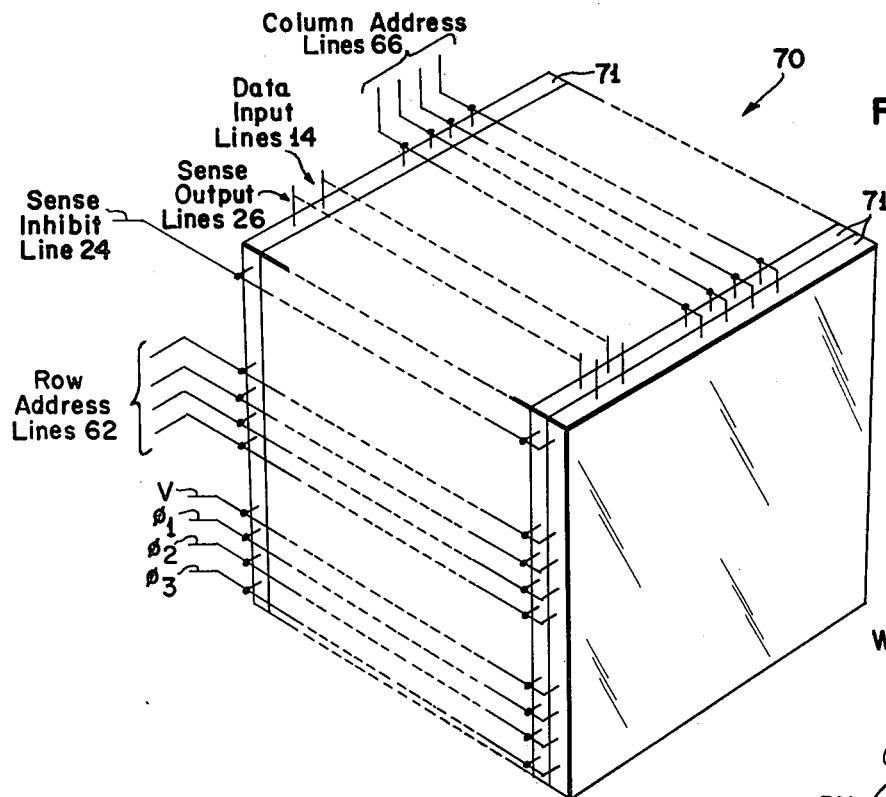
FIG. 8 is a representation of a three-dimensional memory comprised of a plurality of LSI chips, each chip including the circuit of FIG. 6, and showing the interconnections between the chips.

Referring now to FIG. 8, there is shown a three-dimensional memory 70 comprised of a plurality of LSI chips 71, each chip 71 having disposed thereon the circuit shown in FIG. 6, it being understood that the size of the array shown in FIG. 6 may be readily increased by increasing the number of rows and columns in the array and correspondingly expanding address decoders 61 and 65. Although only a single digit is either stored in or read from each chip 71, at any one time, in the circuit of FIG. 6, parallel entry of a word into the memory 70 at data input lines 14 or, alternatively, parallel read-out of a word from sense output lines 26, is obtained by connecting common control lines of each chip 71. Connections between chips 71 of clock lines $\phi_1$, $\phi_2$, $\phi_3$ and sense inhibit lines 24, provide for simultaneous operations on corresponding cells in each of the chips 71 designated by the commonly connected row and column address lines 62 and 66, respectively. In order to store a word in the memory 70, a row and column address of a storage location is placed on lines 62 and 66, respectively, and the word to be stored is placed on data input lines 14. The word on data input lines 14 is then stored in the memory 70 by sequentially pulsing clock lines $\phi_1$, $\phi_2$ and $\phi_3$, in that order, it being assumed that a voltage level is normally maintained at sense inhibit line 24 and voltage line V.

In order to read a word identified by a row and column address placed on lines 62 and 66, respectively, clock lines $\phi_1$, $\phi_2$ and $\phi_3$ are sequentially pulsed and the voltage level on sense inhibit line 24 is momentarily interrupted during the pulse on line $\phi_3$ as the digits of a word are strobed for a read out on sense output lines 26 of the memory 70. It should be understood from the prior description of the circuit shown in FIG. 6 and incorporated in each chip 71, that each time a word is either stored in the memory 70 or read from it, a row of capacitively stored digits in each chip 71 is refreshed.

From the above description, it will be apparent that there is thus provided a device of the character described possessing the particular features of advantage before enumerated as desirable, but which obviously is susceptible of modification in its form, proportions, detail construction and arrangement of parts without departing from the principle involved or sacrificing any of its advantages. It is to be understood that the invention is not limited to the specific features shown, but that the means and construction herein disclosed comprise the preferred form of several modes of putting the invention into effect, and the invention is, therefore, claimed in any of its forms of modifications within the legitimate and valid scope of the appended claims.

What is claimed is:

1. An LSI memory array comprising: a plurality of memory cells arranged in rows and columns, each of the memory cells having means for capacitively storing a binary digit by the presence or absence of a stored charge therein; means for selecting a row of memory cells and supplying a read signal to the memory cells of the selected row to produce signals indicating which memory cells in the row are storing a charge therein; respective read storage means provided for respective columns of the memory array for storing the signals produced by the read signal supplied to the memory cells of the selected row; means for selecting a column of memory cells and reading from the memory array the stored signal in said read storage means associated with the memory cell of the selected column; and refresh means for refreshing those memory cells common to the selected row and having a stored charge therein as indicated by the signals stored in said read storage means.

2. The invention in accordance with claim 1, wherein said means for selecting a row of memory cells includes means for supplying a write signal to the memory cells of the selected row to provide for the selected row of memory cells to be refreshed by said refresh means.

3. The invention in accordance with claim 2, wherein said means for selecting a column of memory cells includes means for gating to the selected column of memory cells an input signal representing a binary digit to be stored in the memory array, the input signal being stored by the write signal in the memory cell common to the selected row and to the selected column.

4. The invention in accordance with claim 1, wherein said read storage means for each column of the memory array includes a capacitive charge which is discharged or retained by the signal produced by the read signal to provide a stored signal in each of said read storage means indicating the content of the memory cell common to the column of each of said read storage means and the selected row.

5. The invention in accordance with claim 1, wherein said refresh means includes a stored capacitive charge for each column of the memory array which is provided to refresh the memory cells common to the selected row and having a stored charge therein.

6. The invention in accordance with claim 1, wherein said refresh means includes means for causing the stored signal in said read storage means that is read from the memory array to be stored in the memory cell common to the selected row and the selected column.

7. An LSI memory array, comprising: a plurality of memory cells arranged in rows and columns, each of the memory cells having means for capacitively storing a binary digit by the presence or absence of a stored charge therein; a means for selecting a row of memory cells and supplying a common read signal to the memory cells of the selected row; a read storage means for each column for storing a first voltage charge capable of operating on the memory cells of each column, the read signal and the stored first voltage charge coacting with the memory cells so that each of the stored binary digits are read from a memory cell into said read storage means; means for selecting a column of memory cells and reading from the memory array the stored signal in said read storage means of the selected column; means for storing a second voltage charge provided for each column of memory cells; and refresh means using the stored second voltage level to coact with said read storage means of corresponding columns to refresh the memory cells of the selected row having a stored charge therein.

8. The invention in accordance with claim 7, wherein said means for selecting a column of memory cells includes means for gating to the selected column of memory cells an input signal representing a binary digit to be stored in a memory cell of the selected column.

9. The invention in accordance with claim 8, wherein said means for selecting a row of memory cells includes means for supplying a write signal to the memory cells of the selected row, said write signal causing the input signal gated to the selected column to be stored in the memory cell common to the selected row and the selected column.

10. The invention in accordance with claim 7, wherein said means for selecting a row of memory cells includes means for supplying a write signal to the memory cells of the selected row to enable each of the memory cells in the selected row to be refreshed by the second voltage charge provided for each column of memory cells.

11. The invention in accordance with claim 7, wherein said refresh means includes means for causing the stored signal in said read storage means that is read from the memory array to be stored in the memory cell common to the selected row and the selected column.

12. An LSI memory array comprising: a plurality of memory cells arranged in rows and columns, each of the memory cells having means for capacitively storing a binary digit by the presence or absence of a stored charge therein; means for selecting a row of memory cells and supplying a read signal to the memory cells of the selected row to produce signals indicating which memory cells common to the selected row are storing a charge therein; means for supplying an input signal representing a binary digit to be stored in the memory array; means for selecting a column of memory cells in the memory array to enable the input signal to be stored in a memory cell of the selected column; said means for selecting a row of memory cells including means for supplying a write signal to the memory cells of he selected row of causing the input signal to be stored in the memory cell common to the selected row and the selected column; and refresh means provided in each column and responding to the write signal to refresh those memory cells of the selected row having a stored charge therein as indicated by the signals produced by the read signal to the memory cells of the selected row.

13. The invention in accordance with claim 12, wherein storage means are provided for each column of the memory array for storing the signals produced by the read signal to the memory cells of the selected row.

14. The invention in accordance with claim 12, wherein said refresh means includes a refresh capacitive storage means provided for each column of the memory array, means for charging said refresh capacitive storage means, and means for causing said refresh capacitive storage means to coact with the signals produced by the read signal to the memory cells of the selected row so that the charged capacitive storage means refreshes only those memory cells of the selected row storing a charge therein.

15. An LSI memory system for the storage of words comprised of a plurality of binary digits, the memory system including: a memory array provided for each digit of a stored word, memory cells arranged in rows and columns in each of the memory arrays and having means for capacitively storing a binary digit by the presence or absence of a stored charge therein; a read storage means for each column of memory cells for storing a first voltage level for each column of memory cells; means for selecting a corresponding row of memory cells in each of the memory arrays and supplying a read signal to the memory cells of the selected rows to cause the memory cells to coact with the stored first voltage in each column so that each of the binary digits are read from a memory cell into said read storage means; means for selecting corresponding columns of memory cells in each of the memory arrays to read from each of the memory arrays the stored signal in said read storage means of the selected column, the stored signals read from the memory arrays forming a stored word read from the memory system; means for storing a second voltage level for each column of memory cells; and refresh means for causing the stored second voltage level for each column to coact with said read storage means to refresh those memory cells having a stored charge therein in each selected row of the memory system.

16. The invention in accordance with claim 15, wherein said means for selecting a corresponding row of memory cells in each of the memory arrays includes means to supply a write signal to the memory cells of the selected row to provide for the selected rows of memory cells to be refreshed by said refresh means.

17. The invention in accordance with claim 15, wherein said means for selecting a corresponding column of memory cells in each of the memory arrays includes means for supplying an input signal to the memory cells of the selected column of each array, each input signal representing a binary digit of a word to be stored in the memory system; and said means for selecting a corresponding row of memory cells in each of the memory arrays includes means for supplying a write signal to the memory cells of the selected row of each array, the write signal causing each of the respective input signals to be stored in the memory cell common to the selected row and the selected column of the respective memory arrays.

18. An LSI memory array comprising: a plurality of memory cells, each of the memory cells having means for capacitively storing a binary digit by the presence or absence of a stored charge therein; means for selecting a group of memory cells and supplying a read signal to the memory cells of the selected group to produce signals indicating which memory cells of the group are storing a charge therein; a read storage means provided for each memory cell of the selected group for storing signals produced by the read signal supplied to the memory cells of the selected group; means for selecting at least one memory cell of the selected group and reading from the memory array the stored signal in said read storage means associated with the selected memory cell of the selected group; and refresh means for refreshing those memory cells of the selected group having a storage charge therein as indicated by the signals stored in said read storage means.

19. The invention in accordance with claim 18, wherein said means for selecting a group of memory cells includes means for supplying a write signal to the memory cells of the selected group to provide for the refreshing of the memory cells by said refresh means.

20. The invention in accordance with claim 18, wherein said means for selecting at least one memory cell of the selected group includes means for supplying an input signal to the selected memory cell, the input signal representing a binary digit to be stored in the memory array; and said means for selecting a group of memory cells includes means for supplying a write signal to the memory cells of the selected group, the write signal causing the input signal to be stored in the selected memory cell.

21. In an LSI memory array, a plurality of memory cells arranged in rows and columns, each memory cell comprised of: a first, a second and a third semiconductor device, said first device having means for storing a binary digit by the presence or absence of a capacitive charge therein, said second device connecting to said first device and providing for reading the stored binary digit in said first device by producing a signal when interrogated, the signal indicating the presence or absence of a capacitive charge in said first device, and said third device connecting to said first device and providing for storing a binary digit in said first device by either charging or discharging said first device.

22. The invention in accordance with claim 21, wherein each of said second device in memory cells of a common row are commonly connected to provide for the memory cells of a common row to be commonly interrogated to read the binary digits stored therein by producing signals from each of said second devices indicating the presence or absence of a capacitive charge in each corresponding first device.

23. The invention in accordance with claim 21, wherein each of said second devices in memory cells of a common column are commonly connected to provide a common line for reading out the digit stored in a memory cell of the column of memory cells when the second device of the memory cell is interrogated.

24. The invention in accordance with claim 21, wherein each of said third devices in memory cells of a common row are commonly connected to enable said first device of each of the memory cells of a common row to be charged in accordance with the signal read from said second device.

25. The invention in accordance with claim 21, wherein each of said third devices in memory cells of a common column are commonly connected to provide a common line for an input signal representing a binary digit to be stored in a memory cell of a column of memory cells, the input signal being gated through said third device of the memory cell to capacitively store a binary digit in said first device of the memory cell.

26. An LSI memory array comprising: a plurality of memory cells arranged in rows and columns, each of the memory cells having means for storing a binary digit by the presence or absence of a stored capacitive charge therein; means for selecting a row of memory cells and supplying a read signal to the memory cells of the selected row to produce signals indicating which memory cells in the row are storing a charge therein; a read storage means provided for each column of the memory array for storing the signals produced by the read signal supplied to the memory cells of the selected row; means for supplying an input signal representing a binary digit to be stored in the memory array; means for selecting a column of memory cells and gating the input signal to a selected column of memory cells for storing the input signal in a memory cell common to the selected column; said means for selecting a row of memory cells including means for supplying a write signal to the memory cells of the selected row to store the input signal in the memory cell common to the selected row and the selected column; and refresh means for refreshing those memory cells common to the selected row and having a stored charge therein as indicated by the signals stored in said read storage means.

27. The invention in accordance with claim 26, wherein said refresh means includes a refresh capacitive storage means provided for each column of the memory array, means for charging said refresh capacitive storage means, and means for causing said refresh capacitive storage means to coact with said read storage means associated with corresponding columns of memory cells so that only those memory cells of the selected row having a stored charge therein are refreshed by the charged capacitive storage means.

28. A memory cell unit comprising 3 MOS transistors and 4 external connection lines, each of said transistors having a gate electrode and two terminal electrodes, and operating such that a charge on said gate electrode serves to lower the impedance between said terminal electrodes, and including: a first transistor which provides a gate-terminal capacitance suitable for storing a charge thereon, a second transistor having its terminal electrodes connected to provide a series path with the terminal electrodes of said first transistor, wherein said second transistor has one of its terminal electrodes connected to an external output line and its gate electrode connected externally to a line which may present voltage charge at preselected times, a third transistor having terminal electrodes providing a series path from the gate of said first transistor to an external input line, and said third transistor having its gate electrode connected to an external line which may present voltage charge at pre-selected times, and said first transistor having its gate electrode connected to one terminal electrode of said third transistor.

29. An LSI circuit providing storage, input, output, and refreshment of information in the form of voltage potentials comprising: a memory cell unit as in claim 28; a first metallized line having a distributed capacitance, said first line connected to one terminal electrode of said third transistor; a second metallized line having a distributed capacitance and connected to one terminal electrode of said second transistor; memory-cycle pulse-generation means for generating a first, second, and third phase of sequential voltage pulses, said pulses being utilized for switching purposes; a first switching means responsive to said first phase pulse for application of voltage charge to said second metallized line; a second switching means responsive to said second phase pulse for application of voltage charge to said first metallized line; third switching circuitry means responsive to said third phase pulse for transferring the voltage condition of said second metallized line to a sense output line during a readout operation and for discharging said second metallized line during a data-input-write operaion; fourth switching circuitry means responsive to the voltage condition of said second metallized line and to the third phase pulse for discharging said first metallized line upon the coincidence of a voltage charge on said second metallized line with said third phase pulse; said gate electrode of said third transistor being charged upon each occurrence of a third phase pulse; and said gate electrode of said second transistor being charged upon each occurrence of a second phase pulse; a fifth switching means responsive to each third phase pulse for connecting a data input line to said first metallized line.

30. The LSI circuit of claim 29 including feedback means from said sense output line to said first metallized line for transferring to said first metallized line, the inverse of the voltage condition existing on the sense-output line during the third phase pulse.

31. A cell for an MOS random-access integrated circuit memory which utilizes at least a separate select-read, select-write, write, and read lines comprising:

a capacitor adaptable for storing an electrical charge;

a first MOS device coupled to said select-write line, said write line and said capacitor for allowing a current to flow between said capacitor and said write line when a predetermined signal is applied to said select-write line;

a second MOS device coupled to said capacitor, said select-read line and said read line for allowing a current to flow through said device when said capacitor is charged; and a third MOS device coupled to said capacitor, said second MOS device and said select-read line for allowing a current to flow through said device when a predetermined signal is applied to said select-read line;

whereby a bit of information may be selectively stored or written onto said capacitor and selectively read from said capacitor.

* * * * *